(12) United States Patent
Mink et al.

(10) Patent No.: US 9,772,562 B2
(45) Date of Patent: Sep. 26, 2017

(54) METHOD AND APPARATUS FOR MEASURING A STRUCTURE ON A SUBSTRATE, MODELS FOR ERROR CORRECTION, COMPUTER PROGRAM PRODUCTS FOR IMPLEMENTING SUCH METHODS AND APPARATUS

(71) Applicant: ASML Netherlands B.V., Veldhoven (NL)

(72) Inventors: Martijn Peter Mink, Veldhoven (NL); Janne Maria Brok, Veldhoven (NL); Irwan Dani Setija, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/101,511

(22) PCT Filed: Nov. 5, 2014

(86) PCT No.: PCT/EP2014/073836
§ 371 (c)(1),
(2) Date: Jun. 3, 2016

(87) PCT Pub. No.: WO2015/082158
PCT Pub. Date: Jun. 11, 2015

(65) Prior Publication Data
US 2016/0313653 A1   Oct. 27, 2016

(30) Foreign Application Priority Data
Dec. 5, 2013   (EP) .................................... 13195846

(51) Int. Cl.
*G01B 11/24* (2006.01)
*G03F 7/20* (2006.01)
*G01B 11/27* (2006.01)

(52) U.S. Cl.
CPC ........ *G03F 7/70633* (2013.01); *G01B 11/272* (2013.01); *G03F 7/705* (2013.01); *G03F 7/70625* (2013.01); *G01B 2210/56* (2013.01)

(58) Field of Classification Search
CPC .... G01B 2210/56; G01B 11/02; G01B 11/06; G01B 11/0625; G01B 11/0641;
(Continued)

(56) References Cited

U.S. PATENT DOCUMENTS

| 7,522,293 B2 | 4/2009 | Wu et al. |
| 7,710,540 B2 | 5/2010 | Loopstra et al. |

(Continued)

FOREIGN PATENT DOCUMENTS

| CN | 101393881 A | 3/2009 |
| CN | 102645847 A | 8/2012 |

(Continued)

OTHER PUBLICATIONS

Forstner et al., "A Metric for Covariance Matrices," Institut fur Photogrammetrie, University of Bonn, 1999; 16 pages.
(Continued)

*Primary Examiner* — Michael P Stafira
(74) *Attorney, Agent, or Firm* — Sterne, Kessler, Goldstein & Fox P.L.L.C.

(57) ABSTRACT

A reconstruction process includes measuring structures formed on a substrate by a lithographic process, determining a reconstruction model for generating modeled patterns, computing and minimizing a multi-variable cost function including model errors. Errors induced by nuisance parameters are modeled based on statistical description of the nuisance parameters' behavior, described by probability density functions. From the statistical description model errors are calculated expressed in terms of average model errors and weighing matrices. These are used to modify the
(Continued)

cost function so as to reduce the influence of the nuisance parameters in the reconstruction, without increasing the complexity of the reconstruction model. The nuisance parameters may be parameters of the modeled structure, and/or parameters of an inspection apparatus used in the reconstruction.

19 Claims, 5 Drawing Sheets

(58) Field of Classification Search
CPC ....... G01B 11/14; G01B 11/24; G01B 11/245; G01B 11/272; G01B 15/00; G01B 1/00; G01B 11/16; G01B 2210/00; G01N 2021/95615
See application file for complete search history.

(56) References Cited

U.S. PATENT DOCUMENTS

| | | | |
|---|---|---|---|
| 7,948,609 | B2 | 5/2011 | Schneiders et al. |
| 2003/0187602 | A1 | 10/2003 | Bao et al. |
| 2006/0062445 | A1 | 3/2006 | Verma et al. |
| 2007/0222979 | A1* | 9/2007 | Van Der Laan ..... G01N 21/956 356/243.1 |
| 2009/0083013 | A1 | 3/2009 | Li et al. |
| 2010/0049484 | A1* | 2/2010 | Berlin ..................... G01J 3/46 703/2 |
| 2011/0043780 | A1 | 2/2011 | Corbeij et al. |
| 2012/0123748 | A1 | 5/2012 | Aben et al. |
| 2012/0212718 | A1 | 8/2012 | Den Boef |
| 2012/0243004 | A1* | 9/2012 | El Gawhary .......... G01B 11/24 356/601 |
| 2013/0054186 | A1 | 2/2013 | Boef |
| 2013/0124141 | A1 | 5/2013 | Brill et al. |

FOREIGN PATENT DOCUMENTS

| | | |
|---|---|---|
| CN | 102884396 A | 1/2013 |
| EP | 1628164 A | 8/2005 |
| TW | I388944 B | 12/2008 |
| TW | I396057 B | 8/2009 |
| WO | WO 2008/039674 A2 | 4/2008 |
| WO | WO 2008/096364 A2 | 8/2008 |
| WO | WO 2010/025950 A1 | 3/2010 |
| WO | WO 2014/004682 A1 | 1/2014 |

OTHER PUBLICATIONS

Gross et al., "Evaluation of measurement uncertainties in EUV scatterometry," Weierstrass Institute for Applied Analysis of Stochastics, SPIE, Modeling Aspects in Optical Metrology II, vol. 7390, 2009; 12 pages.

Clarmann et al., "On the role of non-random errors in inverse problems in radiative transfer and other applications," Journal of Quantitative Spectroscopy & Radiative Transfer, vol. 71, 2001; pp. 39-46.

International Search Report and Written Opinion of the International Search Authority directed to related International Patent Application No. PCT/EP2014/073836, mailed Mar. 18, 2015; 10 pages.

International Preliminary Report on Patentability directed to related International Patent Application No. PCT/EP2014/073836, issued Jun. 7, 2016; 7 pages.

* cited by examiner

METHOD AND APPARATUS FOR MEASURING A STRUCTURE ON A SUBSTRATE, MODELS FOR ERROR CORRECTION, COMPUTER PROGRAM PRODUCTS FOR IMPLEMENTING SUCH METHODS AND APPARATUS

CROSS-REFERENCE TO RELATED APPLICATIONS

This application claims the benefit of EP application 13195846, which was filed on Dec. 5, 2013 and which is incorporated herein in its entirety by reference.

FIELD

The present invention relates to methods and apparatus for measuring a structure on a substrate and models for error correction. The invention may be applied for example in model based metrology of microscopic structures, for example to assess critical dimensions (CD) or overlay performance of a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to monitor the lithographic process, parameters of the patterned substrate are measured. Parameters may include, for example, the overlay error between successive layers formed in or on the patterned substrate and critical linewidth (CD) of developed photosensitive resist. This measurement may be performed on a product substrate and/or on a dedicated metrology target. There are various techniques for making measurements of the microscopic structures formed in lithographic processes, including the use of scanning electron microscopes and various specialized tools. A fast and non-invasive form of specialized inspection tool is a scatterometer in which a beam of radiation is directed onto a target on the surface of the substrate and properties of the scattered or reflected beam are measured. Two main types of scatterometer are known. Spectroscopic scatterometers direct a broadband radiation beam onto the substrate and measure the spectrum (intensity as a function of wavelength) of the radiation scattered into a particular narrow angular range. Angularly resolved scatterometers use a monochromatic radiation beam and measure the intensity of the scattered radiation as a function of angle.

By comparing the properties of the beam before and after it has been reflected or scattered by the substrate, the properties of the substrate can be determined. This can be done, for example, by comparing data obtained from measurement of the reflected or scattered beam with model (simulated) diffraction signals calculated from a parameterized model. The calculated signals can be pre-calculated and stored in a library, the library representing a plurality of candidate substrate structures distributed in a parameter space of the parameterized model. Alternatively or in addition, parameters can be varied during an iterative search process, until a calculated diffraction signal matches the measured signal. In U.S. Pat. No. 7,522,293 (Wu) and US 2012/0123748A1, for example, these two techniques are described for example as 'library based' and 'regression based' processes, respectively.

In particular for complex structures, or structures including particular materials, the number of parameters required to model the scattered beam accurately is high. A 'model recipe' is defined in which parameters are defined as either given ('fixed') or variable ('floating'). For floating parameters, the permitted range of variation is defined, either in absolute terms or by reference to deviation from a nominal value. Each floating parameter in the model represents another 'degree of freedom' in the model, and consequently another dimension in the multidimensional parameter space in which the best matching candidate structure is to be found. Even with a handful of parameters, the size of computational tasks quickly becomes very large, for example by raising the number of library samples unacceptably. It also raises the risk of falsely matching parameter sets that do not correspond to the measured substrate. Fixing a parameter to a value that is not identical to what is actually in the measured structure in some cases may have little impact on the reconstruction. Other times, however, differences between the fixed value and the real value of the parameter may distort the matching process significantly so that inaccuracy arises in reconstruction of the parameters of interest. The fixed parameter in such a situation may be referred to as a "nuisance" parameter.

Such nuisance parameters make it difficult to find the right compromise between accuracy and practicality of computation. Nuisance parameters may be parameters of the model of the structure being measured, but they may also be parameters of an apparatus used to obtain measurements. That is to say, different apparatuses may obtain slightly different diffraction signals from the same structure, and therefore yield slightly different measurements of a parameter of interest.

SUMMARY

The inventors have recognized that statistical information about a nuisance parameter and its effect on the observed diffraction signals can be used to improve the accuracy of reconstruction, without making the nuisance parameter a floating parameter in the model.

The invention in a first aspect provides a method of measuring parameters of a structure on a substrate, said method comprising the steps:
(a) defining a mathematical model in which shape and material properties of said structure, are represented by a plurality of parameters including at least one parameter of interest;

(b) illuminating said structure with one or more beams of radiation and detecting a signal arising from interaction between said radiation and said structure;

(d) calculating a plurality of model signals by simulating interaction between said radiation and said mathematical model while varying the parameter of interest and while not varying at least one other parameter;

(e) calculating a model of influence for said other parameter by simulating interaction between said radiation and said mathematical model while varying the other parameter in accordance with an assumed statistical behavior;

(f) calculating degrees of matching between the detected signal and at least some of the model signals calculated in step (d), while using the model of influence to suppress an influence of variations of said other parameter that are not represented in the model signals;

(g) reporting a measurement of said parameter of interest based on the calculated degrees of matching.

Said model of influence may for example provide a weighing matrix, by which the degree of matching between detected signal and a model signal depends more on some parts of the signal than others. In an embodiment where the detected signal is a two-dimensional diffraction pattern obtained by angle-resolved scatterometry, said weighing matrix may for example define for some pixels in said diffraction pattern a lower weight than other pixels for calculating the degree of matching.

Alternatively or in addition, said model of influence may provide a mean error signal which is subtracted from the detected signal before a degree of matching is calculated. In an embodiment where the detected signal is a two-dimensional diffraction pattern obtained by angle-resolved scatterometry, said model of influence may for example provide a mean error matrix whereby different error values are subtracted from different pixels of the detected diffraction pattern prior to calculating the degree of matching.

The other parameter may be a parameter of the shape or material of the structure modeled in step (a), or a parameter of an inspection apparatus used to obtain the detected signal in step (b). In a practical implementation, several other parameters may be defined and corrected simultaneously.

The model of assumed statistical behavior may comprise a nominal value and a variance for the or each said other parameter. Where a plurality of other parameters are defined, their assumed statistical behavior may be modeled independently from one another or with covariance relations between them.

The invention in a second aspect provides an inspection apparatus for measuring parameters of a structure on a substrate, the apparatus comprising:

a support for a substrate having said structure formed thereon;

an optical system for illuminating the structure with one or more beams of radiation and detecting a signal arising from interaction between said radiation and said structure;

a processor arranged to calculate a plurality of model signals by simulating interaction between said radiation and a mathematical model in which shape and material properties of said structure are represented by a plurality of parameters including at least one parameter of interest, to calculate degrees of matching between the detected signal and at least some of the calculated model signals and to report a measurement of said parameter of interest based on the calculated degrees of matching, wherein said processor is arranged to calculate said plurality of model signals while varying the parameter of interest and while not varying at least one other parameter, and wherein said processor is further arranged when calculating said degrees of matching to use a model of influence to suppress an influence of variations of said other parameter that may be present in the detected signal but is not represented in the model signals.

The apparatus may be implemented by adding suitable data processing functions to an existing inspection apparatus, such as a scatterometer The invention further provides a computer program product comprising machine-readable instructions for causing a processor to perform the steps (d) and (f) of a method according to the invention as set forth above.

The computer program product may further comprise instructions for causing a processor to perform the step (e) of the method.

The invention yet further provides a computer program product comprising machine-readable instructions for causing a processor to perform the step (e) of a method according to the invention as set forth above, to calculate a model of influence for use by an inspection apparatus performing steps (a) to (d) and (f) and (g) of the method.

These and other aspects, features and advantages of the invention will be readily understood from a consideration of the exemplary embodiments described below.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
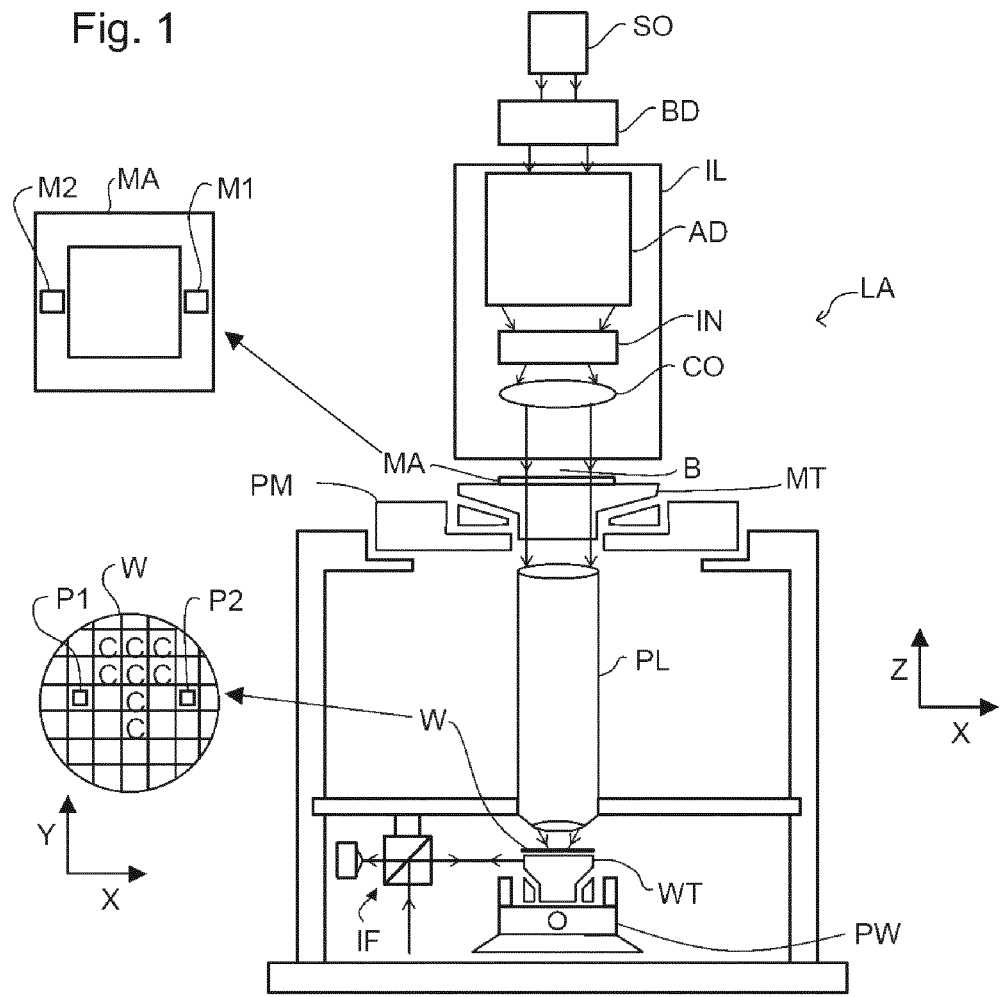
FIG. 1 is a schematic diagram of a lithographic apparatus.

FIG. 1 schematically depicts a lithographic apparatus LA. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist coated wafer) W and connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table MT), and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment markers may also be included within dies, in amongst the device features, in which case it is desirable that the markers be as small as possible and not require any different imaging or process conditions than adjacent features. The alignment system, which detects the alignment markers is described further below.

The depicted apparatus can be used in a variety of modes, including for example a step mode or a scan mode. The construction and operation of lithographic apparatus is well known to those skilled in the art and need not be described further for an understanding of the present invention.

Figure 2:
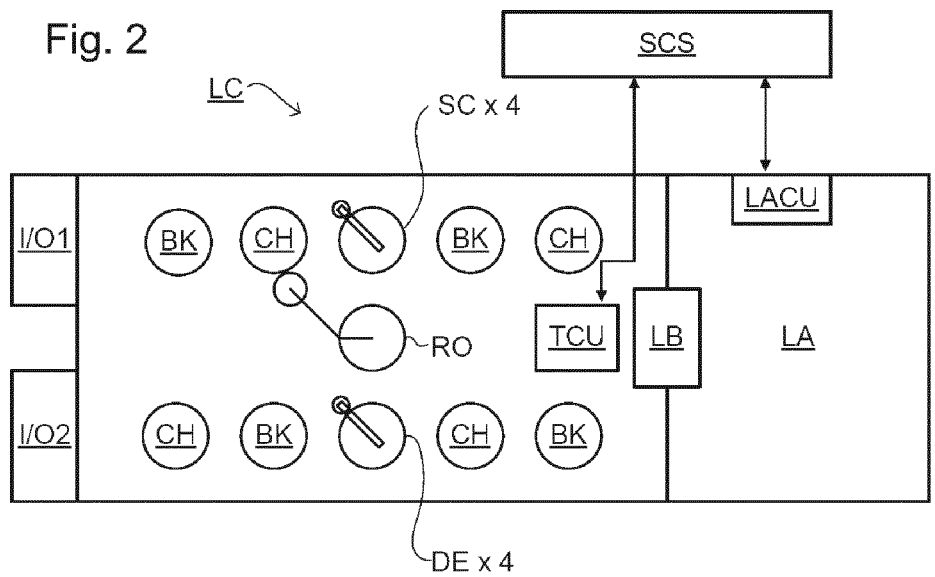
FIG. 2 is a schematic diagram of a lithographic cell or cluster.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. If errors are detected, adjustments may be made to exposures of subsequent substrates, especially if the inspection can be done soon and fast enough that other substrates of the same batch are still to be exposed. Also, already exposed substrates may be stripped and reworked—to improve yield—or discarded, thereby avoiding performing exposures on substrates that are known to be faulty. In a case where only some target portions of a substrate are faulty, further exposures can be performed only on those target portions which are good.

An inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast—there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

Figure 3:
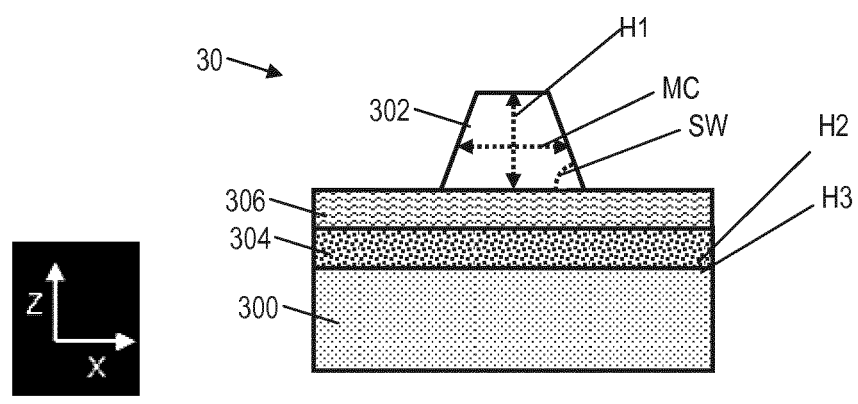
FIG. 3 is a schematic cross-section through a first example structure to be measured by the process of FIG. 5 or FIG. 6, with associated model parameters.

FIG. 3 illustrates a target 30, and some of the parameters that define its shape, as a simple form of structure to be inspected. A substrate 300, for example a silicon wafer, carries a diffraction grating formed by many parallel bars that have been formed by exposing and developing a layer of resist material. The grating need not comprise raised bars, which are illustrated and mentioned as only an example. Suitable features include upstanding bars, contact holes, etc., that have been formed by lithography, or by lithography followed by etching, deposition and other process steps. Bars are chosen here purely for simplicity.

Feature 302 represents a cross section of one of the structures that is repeated many times to make up the grating. Under the resist is a layer 304, which in a common example would be simply the 'native' oxide layer on a silicon wafer, for example having a thickness of 1 to 3 nm. In a real product, there may be many layers of different properties under the feature 302. Prior to coating the substrate with resist and exposing, an anti-reflective (BARC) layer 306 has been applied to the substrate to improve the quality of the printed pattern, in a known manner.

Figure 5:
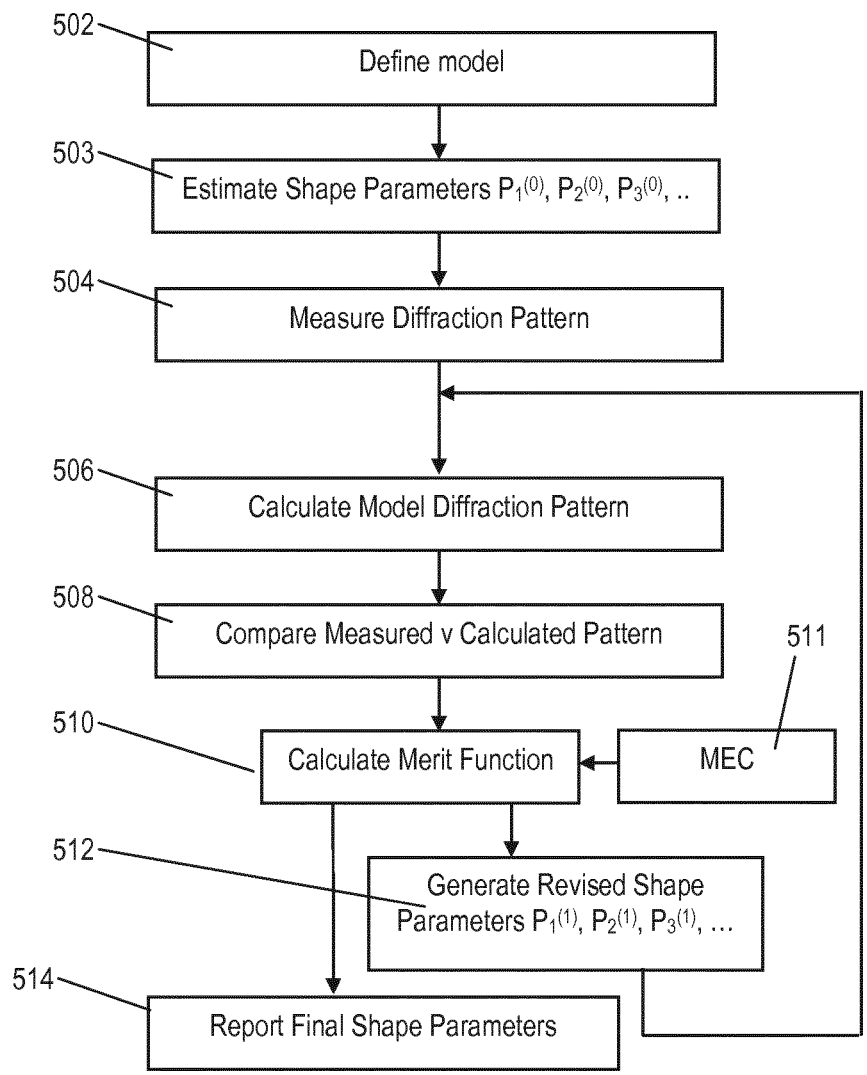
FIG. 5 depicts an example process for reconstruction of a structure from scatterometer measurements, with correction of model errors in accordance with an embodiment of the present invention.
Figure 6:
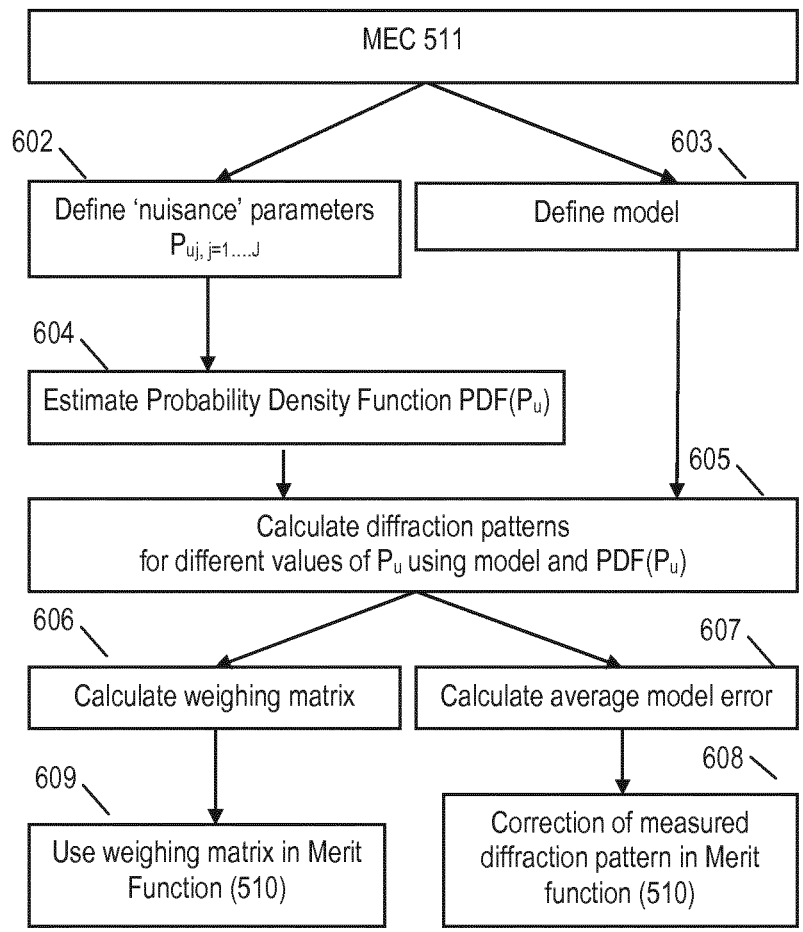
FIG. 6 depicts an example process using the invention for estimation and correction of model errors in the process of FIG. 5.

Parameters of the feature 302, which are to be measured by a process such as shown in FIG. 5 or FIG. 6, include feature height H1, mid-height critical dimension (mid-CD or MCD) and side wall angle SWA. Other parameters can be defined if desired. SWA may be defined separately for left and right side walls, if asymmetries are to be measured. Any other features like top rounding, footing or a coating trapezoid accounting for Line Edge Roughness (LER) might be added to the model to increase accuracy.

These parameters H1, MCD, SWA will contribute in different ways to the diffraction pattern that will be observed when this target 30 is measured by scatterometry. Other shape parameters that will affect the diffraction pattern are the heights (thicknesses) of the underlying layers 306, 304, which are labeled H2, H3 respectively. In addition to geometrical parameters, optical parameters can be also included in the model. To model the target, and so permit the calculation of modeled diffraction patterns, estimated values for these parameters are used in the calculations of step 506. When one takes into account the number of layers, the shape parameters of the feature 302 and potentially also underlying features and layers, it becomes clear that the parameter space, in which the search for the best fitting parameter set is to be performed, is highly multi-dimensional. The target grating pattern itself may be two-dimensional. Additional parameters required for modeling are the properties of all the different materials, such as their refractive indices, extinction coefficients. These may be so well defined that they can be regarded as fixed parameters, or they may themselves be subject to uncertainties. They may need to be further subdivided according to the wavelength and polarization of the incoming radiation.

Figure 4:
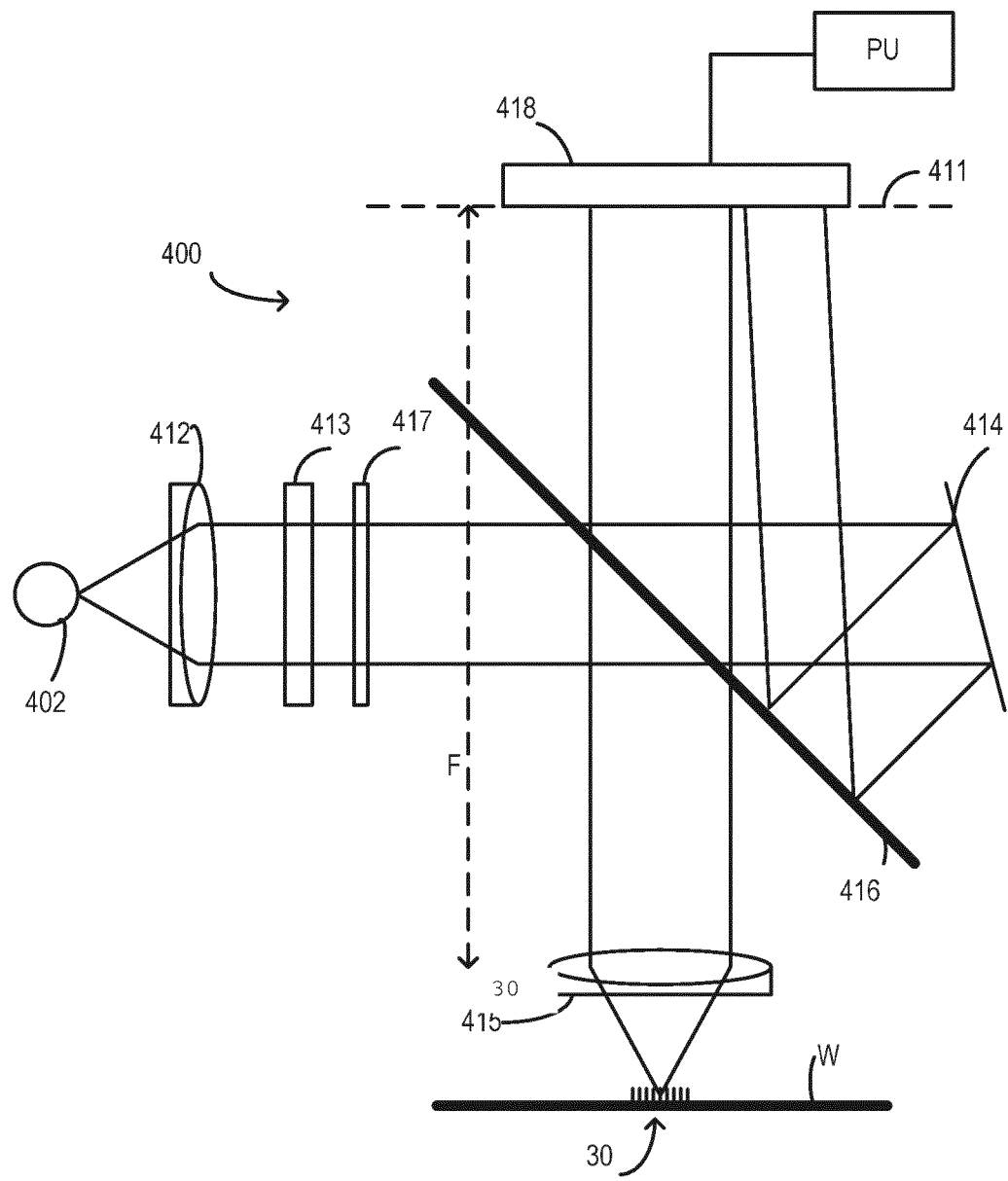
FIG. 4 illustrates the operating principles of a scatterometer.

FIG. 4 shows schematically scatterometer that may be used as an inspection apparatus in an embodiment of the present invention. In this apparatus, radiation emitted by radiation source 402 is collimated using lens system 412 and transmitted through interference filter 413 and polarizer 417, reflected by partially reflective surface 416 and focused onto substrate W via a microscope objective lens 415. Lens 415 has a high numerical aperture (NA), for example 0.9 or 0.95 or more Immersion scatterometers may even have lenses with numerical apertures over 1. Radiation reflected and diffracted by target 30 is collected by the same objective lens 415 then transmitted through partially reflecting surface 416 into a detector 418 in order to have the scatter (diffraction) spectrum detected. The detector may be located in the back-projected pupil plane 411, which is at the focal length of the lens system 415, however the pupil plane may instead be re-imaged with auxiliary optics (not shown) onto the detector. The pupil plane is the plane in which the radial position of radiation defines the angle of incidence and the angular position defines azimuth angle of the radiation. The detector 418 in this example is a two-dimensional detector so that a two-dimensional angular scatter spectrum of a substrate target 30 can be measured. The detector 418 may be, for example, an array of CCD or CMOS sensors, and may use an integration time of, for example, 40 milliseconds per frame.

A reference beam is often used for example to measure the intensity of the incident radiation. To do this, when the radiation beam is incident on the beam splitter 416, part of it is transmitted through the beam splitter as a reference beam towards a reference mirror 414. The reference beam is then projected onto a different part of the same detector 418 or alternatively on to a different detector (not shown). Signals from the detectors are received in digital form by a processing unit PU, which performs calculations to reconstruct mathematically the target structure 30.

A set of interference filters 413 is available to select a wavelength of interest in the range of, say, 405-790 nm or even lower, such as 200-300 nm. The interference filter may be tunable rather than comprising a set of different filters. A grating could be used instead of interference filters. In the following description, the term 'light' shall be used to refer to the radiation used in the scatterometry technique. Use of the term 'light' in relation to radiation used in scatterometry or any other metrology technique is not intended to imply any limitation to radiation in the visible part of the spectrum.

The detector 418 may measure the intensity of scattered light at a single wavelength (or narrow wavelength range), the intensity separately at multiple wavelengths or integrated over a wavelength range. Furthermore, the detector may separately measure the intensity of transverse magnetic- and transverse electric-polarized light and/or the phase difference between the transverse magnetic- and transverse electric-polarized light.

Using a broadband light source (i.e. one with a wide range of light frequencies or wavelengths—and therefore of colors) is possible, which gives a large etendue, allowing the mixing of multiple wavelengths. Where a component in the broadband mix has a bandwidth of, say, $\Delta\lambda$, it can be advantageous to provide a spacing of at least 2 $\Delta\lambda$ (i.e. twice the bandwidth) between components. Several "sources" of radiation can be different portions of an extended radiation source which have been split using fiber bundles. In this way, angle resolved scatter spectra can be measured at multiple wavelengths in parallel. A 3-D spectrum (wavelength and two different angles) can be measured, which contains more information than a 2-D spectrum. This allows more information to be measured which increases metrology process robustness. This is described in more detail in EP 1628164 A.

The target 30 on substrate W may be a 1-D grating, which is printed such that after development, the bars are formed of solid resist lines. The target 30 may be a 2-D grating, which is printed such that after development, the grating is formed of solid resist pillars or vias (holes) in the resist. The bars, pillars or vias may alternatively be etched into the substrate. This pattern is sensitive to chromatic aberrations in the lithographic projection apparatus, particularly the projection system PL, and illumination symmetry and the presence of such aberrations will manifest themselves in a variation in the printed grating. Accordingly, the scatterometry data of the printed gratings is used to reconstruct the gratings. The parameters of the 1-D grating, such as line widths and shapes, or parameters of the 2-D grating, such as pillar or via widths or lengths or shapes, may be parameters of interest in the reconstruction process, performed by processing unit PU, from knowledge of the printing step and/or other scatterometry processes.

The scatterometer of FIG. 4 is only one example of an angle-resolved scatterometer, and other forms can be used without departing from the principles of the present invention. Furthermore the invention can be applied equally with diffraction patterns obtained by spectroscopic (energy-resolved) scatterometry.

Reconstruction Process—Introduction

A detailed description of pattern reconstruction processes such as 'regression based' and 'library based' methods, as well as a description of different types of scatterometers, can be found in US 2012/0123748A1. The present document describes the use of a numerical method, referred to herein as Model Error Correction (MEC) method, for avoiding and/or correcting errors in a 'regression based' reconstruction process. The MEC method may be used in other reconstruction models such as 'library based' processes and hybrids of regression and library processes. The MEC method can be applied in different reconstruction processes.

FIG. 5 illustrates a 'regression based' process for reconstruction of a target using a parameterized model and diffraction patterns (diffraction spectra) detected using an inspection apparatus such as a scatterometer. In this type of reconstruction process, a diffraction pattern based on a first estimate of the target shape (a first candidate structure) is calculated and compared with the measured diffraction pattern. The calculation simulates the interaction between radiation and the structure described by the model. Parameters of the model are then varied systematically and the diffraction pattern re-calculated in a series of iterations, to generate new candidate structures and so arrive at a best fit. The target will be assumed for this description to be a structure periodic in one direction, as described with reference to FIG. 3, for example. In practice it may be periodic in two (or more) directions, and the processing will be adapted accordingly. The diffraction pattern may be for example a 2-D pupil image detected by sensor 418 in the scatterometer of FIG. 4.

In the terminology of the introduction and claims, the diffraction pattern measured by the scatterometer is an example of a detected signal. The diffraction patterns calculated using the parameterized model are examples of model signals. The steps of the method in more detail are as follows:

502: A 'reconstruction model' is established which defines a parameterized model of the target structure in terms of a number of parameters Pi (P1, P2, P3 and so on). These parameters may represent for example, in a 1-D periodic structure, the angle of a side wall, the height or depth of a feature, the width of the feature. Material properties of the target and underlying layers are also represented by parameters such as refractive index (at a particular wavelength present in the scatterometry radiation beam) Importantly, while a target structure may be defined by dozens of parameters describing its shape and material properties, the reconstruction model will define many of these to have fixed values, while others are to be variable or 'floating' parameters for the purpose of the following process steps. In the prior publication US 2012/0123748A1 a process is described by which the choice between fixed and floating parameters is made. The set of choices can be referred to as a 'recipe' for the reconstruction process, and different recipes can be tried. For example, the prior publication introduces ways in which parameters can be permitted to vary without being fully independent floating parameters. These techniques can be adopted or not, in implementing the present invention. For the purposes of describing FIG. 5, only the floating parameters are considered as parameters pi. The handling of other parameters in a novel manner will be discussed in detail below.

503: A model target shape is estimated by setting initial values Pi(0) for the floating parameters (i.e. P1(0), P2(0), P3(0) and so on). Each floating parameter will be generated within certain predetermined ranges, as defined in the recipe.

504: The diffraction pattern of the actual target on the substrate is measured using a scatterometer. This measured diffraction pattern is forwarded to a calculation system such as a computer. The calculation system may be the processing unit PU referred to above, or it may be a separate apparatus.

506: The parameters representing the estimated shape of the target, together with material properties of the different elements of the modeled target, are used to calculate the scattering behavior. This may be done for example using a rigorous optical diffraction method such as RCWA or any other solver of Maxwell's equations. This gives the model diffraction pattern for the estimated target shape.

508, 510: The measured diffraction pattern and the model diffraction pattern are then compared and their similarities and differences are used to calculate a "merit function" for the model target shape. In the novel method disclosed herein, an additional calculation 511 labeled MEC (for "model error correction") is used in the calculation of the merit function to reduce the influence of so-called nuisance parameters. The MEC calculation is based on statistical observation of the nuisance parameters and their influence on the observed diffraction patterns. It will be described in more detail below with reference to FIG. 6.

512: Assuming that the merit function indicates that the model needs to be improved before it represents accurately the actual target shape, new parameters P1(1), P2(1), P3(1), etc. are estimated and fed back iteratively into step 506. Steps 506-512 are repeated, so as to search for the set of parameter values that best describes the measured target. In order to assist the search, the calculations in step 506 may further generate partial derivatives of the merit function, indicating the sensitivity with which increasing or decreasing a parameter will increase or decrease the merit function, in this particular region in the parameter space. The calculation of merit functions and the use of derivatives is generally known in the art, and will not be described here in detail.

514: When the merit function indicates that this iterative process has converged on a solution with a desired accuracy, the currently estimated parameters are reported as the measurement of the actual target structure.

The steps of the above process have been presented in a certain order for the sake of explanation. They do not have to be performed in the order described. For example, steps 502 and/or 503 can be performed after making a measurement in step 504. The computation time of this iterative process is largely determined by the forward diffraction model used, i.e. the calculation of the estimated model diffraction pattern using a rigorous optical diffraction theory from the estimated target structure. If more floating parameters are required, then there are more degrees of freedom. The calculation time increases with the number of degrees of freedom. The estimated or model diffraction pattern calculated at 506 can be expressed in various forms. For example, a modeled diffraction spectrum can be compared easily with a diffraction spectrum measured by the scatterometer apparatus of FIG. 4, when the model includes the optical behavior of the apparatus, from illumination source 402 to detector 418, as well as the scattering behavior of the target under inspection. This becomes an important consideration when many targets are to be measured on every substrate.

Throughout this description from FIG. 5 onward, the term 'diffraction pattern' will be used as an example of a detected signal on the assumption that an angularly resolved scatterometer is used, as described in the example apparatus of FIG. 4 and in the prior publication US 2012/0123748A1, mentioned above. The skilled person can readily adapt the teaching to different types of scatterometer, or even other types of measurement instrument.

In summary, the process of FIG. 5 uses a model fit approach to infer parameters of a target structure from a scatterometry measurement signal. The floating parameters may be relevant only internally of the model, or may be genuine parameters of interest (POI) which the system user wants to determine through the measurement and reconstruction process. While the concept is simple in principle, in practice it is difficult to design the reconstruction model. The model should be optimized for accuracy, which may be defined for example by root mean square error (RMSE), and may be decomposed into noise sensitivity (reproducibility) and bias (systematic error). The model optimization should also achieve an optimal measurement response to actual variations of the parameters of interest, while being insensitive to the influence of noise, calibration errors, model approximations and variation of other parameters. Finally, the model runtime should be minimized.

Novel Reconstruction Process—Principle

The state-of-the-art approach to meeting the above objectives is to define a reconstruction model with sufficient floating parameters to describe all possible variations of the structures to be measured. The operator will then fix a subset of these parameters at respective nominal values if the typical variation of these parameters has little or no impact on the measurement signal. The degrees of freedom in the matching process are reduced when a parameter is fixed, which typically improves the stability (condition number) and noise robustness of the fitting process. The speed of the fitting process should increase when a parameter is fixed. In direct regression, for example, a Gauss-Newton (GN) iteration method is often used. The time used for the GN step increases linearly with the number of derivatives that have to be calculated, and hence is roughly proportional to the degrees of freedom.

The fitting process is designed to determine the best fit between measured and modeled signals, where the modeled signal depends on the parameters Pi. This best fit can be expressed in a standard form of Equation (1):

$$P_{fit} = {}^{arg\ min}{}_P \|f - G(P)\|_{c_f^{-1}}^2 \qquad (1)$$

where $P_{fit}$ is the optimized fitting set of floating parameters Pi, f represents the measured diffraction signal, $C_f$ is a photon noise covariance matrix and G (P) represents the forward function (i.e. the modeled diffraction signal) for a candidate parameter set P. These signals may be regarded as vectors (or multidimensional real/complex matrices) whose components are, for example, individual pixel values of a diffraction pupil pattern. The norm "$\| \ldots \|$" in Equation (1) thus represents the 'distance' or error between the measured signal and each modeled signal. The legend "arg min" represents the fitting process which is conducted to seek the parameter set P for which this error, also known as a "cost function" or "merit function", is minimized.

As already mentioned, the reconstruction model is a function of parameters of interest ($P_i$) and nuisance parameters ($P_u$). Examples of nuisance parameters in a typical target include parameters defining the underlying layers (306, 304 in FIG. 3), or parameters of the apparatus used to make a measurement. These different classes of nuisance parameter can be referred to respectively as "application parameters" and "sensor parameters". There is also a distinction that can be made between "calibrated" parameters and "non-calibrated" parameters. The effects of some sensor parameters on the pupil, for each individual instrument, are measured in a calibration process and stored as calibration constants in a calibration file. The calibration file may be used in the modeled signal G as a representation of the sensor properties. Both the measured pattern and the model calculation include the behavior of the apparatus as well as that of the target itself. While the calibration file corrects the model for differences between different apparatuses, it cannot correct all differences, or correct for example drifting of the calibrated parameters over time. Other sensor parameters may exist that are not calibrated, and the nuisance parameters that are application parameters are also (by definition) not calibrated. Therefore nuisance parameters, whether they are application parameters or calibrated parameters, have similar effects and the present discussion applies equally to both classes, except where a distinction is explicitly made. When seeking the right balance between accuracy and computational burden, a solution could be to float any nuisance parameters ($P_u$) that have high sensitivity and strong correlation to the parameters of interest, while the remaining $P_u$ are kept fixed during the reconstruction process. In practice, however, floating all such parameters leads to ill-conditioning of the reconstruction problem as well as increasing the processing required. An alternative solution is provided by the MEC step 511, as will now be described.

FIG. 6 shows calculation of the MEC contribution at step 511 in the method of FIG. 5. While the method of FIG. 5 has to be performed as substrates with measurement targets 30 are produced in real time, some of the steps of the MEC method can be performed in a preparatory or "offline" phase. The numerical method corrects for errors, for example errors induced by nuisance parameters Pu, without treating them as fixed or floating parameters in the reconstruction model G. The impact of each nuisance parameter Pu, described by a probability density function (PDF), can be modeled statistically and included as a 'noise/error term' in the reconstruction model G. Consequently, the number of floating parameters needed to obtain a given accuracy in the reconstruction model is reduced. In the context of the example model structures of FIGS. 3 and 4, Pu may represent, for example, H2, H3 and material properties of some layers. Pi may be reduced to genuine parameters of interest such as H1, MCD and SWA.

The MEC method is described in this document in a general form, but can be varied in a number of ways. The main steps are represented in FIG. 6:

602: A first step is to define the range and character of nuisance parameters Pu.

603: A measurement model (call it H) is defined. As will be illustrated below, the measurement model H in general differs from the reconstruction model G employed in the reconstruction process for real targets in step 502. However, the same model may be implemented in steps 503/603, depending on the application.

604: Statistical behavior of each nuisance parameter Pu is described by a probability density function PDF. The performance MEC method relies on an accurate estimation of the initial parameters of PDF(Pu), such as the nominal value and variance of PDF(Pu). The PDF can be obtained by measurement of the nuisance parameter over a number of representative samples.

605: The impact of Pu on the calculated diffraction pattern can be modelled statistically by using representative values Pu given by PDF(Pu) as input parameters into the model.

606: A weighing matrix can then be calculated for Pu, from the calculated patterns of 605. This weighing matrix, which is a covariance matrix, represents the likely influence of the nuisance parameters in each part of the measured diffraction pattern. The contributions of the nuisance parameters Pu may be modeled in a single weighing matrix. When a linear version of the method is used (explained below), the contributions of each Pu may be modeled separately and added together.

607: A mean or average pattern can then be deduced for Pu, from the calculated patterns of 605. This represents the likely influence of the nuisance parameters in each part of the measured diffraction pattern, in terms of an average error.

608: The average patterns for each Pu are used to correct the measured patterns before calculating the merit function in the (online) reconstruction process of FIG. 5 (step 510).

609: The weighing matrix is used in calculation of the merit function in the online reconstruction process of FIG. 5 (step 510). In this way, influence of the nuisance parameters is reduced in the search process represented by FIG. 5.

The new method may be used to correct (at least partially) various sources of errors in the reconstruction. Steps 607, 608 need not be implemented in all versions of the MEC method, and steps 606, 609 need not be implemented in all versions. Implementing both pairs of steps allows a more comprehensive correction.

The new method employs a model H in step 603 that can differ from the forward model G used in step 502 of the 'real time' reconstruction process. The model H can in particular be more elaborate or "complete" than the model G. Provided it is used only in an offline stage of the process, it is not a problem if the model H takes many hours of processing time. The novel method brings some of the accuracy of that more elaborate model into the reconstruction process without a corresponding increase in the processing burden. Two sets of diffraction patterns may then be obtained using models H and G. The difference between the diffraction patterns obtained using the models H and G for a given value of the parameters of interest, gives the model error $M_{err}$=H(P)−G(P).

The model error, when calculated in accordance with the expected statistical distribution of nuisance values, allows, for example, calculation of the average model error in step 607 of the method. Where the measured and modeled diffraction patterns correspond to the array of pixels on sensor 418, for example, each pixel may be assigned an average model error. By subtraction of the average model error in calculating the merit function (510/608), errors generated by assumptions made in the forward model G are corrected in the reconstruction process.

Weighing matrices may also be derived from the model errors (step 606). These matrices assign weights to specific parts of the diffraction pattern, according to how much those parts are caused to vary by the statistically expected variations in each of the nuisance parameters. In this way the dependence of the reconstruction/calculated patterns on specific nuisance parameters can be reduced. In other words, a "fingerprint" of each nuisance parameter, or set of nuisance parameters, is identified and the reconstruction is performed with the fingerprints of nuisance parameters weighed less, so that the reconstruction is determined more reliably by the fingerprints of the parameters of interest The effect of variations of nuisance parameters on the calculated diffraction patterns are encoded in Jacobian matrices (J). Using the expected statistical distribution of parameter values, the variance and (if known) the covariance of these parameters are derived and expressed in the form of covariance matrices of the model errors.

As mentioned previously, the nuisance parameters $P_u$ may include calibrated parameters and non-calibrated parameters. The non-calibrated parameters are treated as 'free' parameters in measurement model H, whereas they are kept fixed in reconstruction model G. Putting this in mathematical terms, $J_P^G = \partial G / \partial P_u = 0$; $J_P^H = \partial H / \partial P_u \neq 0$). The calibrated parameters are treated as 'free' parameters in both models during the calculation of the model of influence in FIG. 6 (then $J_{P_u}^G \neq 0$; $J_{P_u}^H \neq 0$).

Contributions from different types of parameter and other sources of error can be combined in the weighing matrix. The MEC weighing matrix may for example be the sum of the covariance matrices of the model errors and measurement noise, for example, 'photon noise' inherent in the scatterometer detector 18. The detail of statistical information available about a particular parameter or group of parameters can vary in practice. If comprehensive measurements of the correlation between parameters are not available, the covariance matrix of the sensor parameters $C_u$ can be simplified to diagonal form, representing the variances of the different parameters. Even when no experimental data on the statistics of a certain parameter is available, the influence of variation of that parameter can still be reduced by using an assumed covariance matrix. Experience can be used to estimate likely nominal values and variance, and these entered in the matrix $C_u$. The estimated variance can be refined by comparing results.

Note that, while the method above has been described in the context of the regression process, the weighing matrix and/or average error matrix can be applied to calculate a merit function in other matching processes, for example a library-based process or hybrid process.

More detailed mathematical explanation of the above new method follows, in the context of an application example for correcting sensor parameters (so-called "machine-to-machine" matching). The notations and operations (on vectors or multidimensional matrices) mentioned in the following are well-known. The skilled reader will recognize that $\|M\|$ is the norm of M (M and Q being vectors or matrices), $M^T$ denotes transposed M, $\|M\|_Q$ stands for the weighted norm $\sqrt{M^T Q M}$ and $M^{-1}$ denotes inversed M.

In the following presentation, the subscript 'R' denotes real measured/known values of parameters and the subscript '0' denotes nominal values of parameters.

Recall that the MEC method determines average model errors (referred to as $f_{corr}$), calculated in step 607, and weighing matrices (referred to as C), calculated in step 606. Each of or both of these parameters are used in the calculation of the merit function to correct for model errors. The core equations of this new method read:

$$f_{corr}=E_u[H(P_{i0},u)-G(P_{i0},u)]=\int du U(u)(H(P_{i0},u)-G(P_{i0},u)) \quad (2),$$

where $E_u$ stands for expected values with respect to the nuisance parameters u, and $$C = C_f + cov_u[H(P_{i0}, u) - G(P_{i0}, u)]$$
$$= C_f + \int du U(u)(H(P_{i0}, u) - G(P_{i0,}u) - f_{corr})$$
$$(H(P_{i0}, u) - G(P_{i0}, u) - f_{corr})^T, \quad (3)$$

where U(u) is the joint probability distribution of the nuisance parameters u, $C_f$ is a covariance matrix representing measurement noise (for example photon shot noise in detector 418), du is the differential of u and $cov_u$ represents the covariance matrix of the diffraction pattern with respect to u. The integrals in Equations (2) and (3), may be determined for example by numerical methods such as Riemann sum or sampling.

There will now be described the use of the new method for correcting differences between inspection apparatuses, that is sensor error. In this application of the numerical model, the nuisance parameters are sensor apparatus parameters. The core equations are simplified in the given example to a linearized version. The skilled reader will readily appreciate how the techniques can be applied to the correction of application parameters.

Application Example: 'Machine to Machine' Matching

As mentioned already, the characteristic parameters of different scatterometry measurement sensors differ, reconstruction of a same structure pattern gives different results for different apparatus. The differences are minimized by the calibration process and calibration file, but cannot be eliminated completely. The reconstruction model can be modified in order to include 'machine to machine' matching, for example, the model may compensate for sensors differences. The practical benefit of this correction is that measurement results from different apparatuses can be made comparable without introducing errors.

The measurement model H employed in step 603 differs from the forward (reconstruction) model G of step 502. Therefore, in this example the model error is defined by $M_{err}=H(P_i,u)-G(P_i,u)$. Note that the forward model G depends on the sensor parameters via the calibration file. Main steps of the 'machine to machine' matching method are presented in this section.

The cost function including terms representing 'sensor errors' can be expressed in the form of Equation (4):

$$F(P_i,u_R)=\|f(P_{iR},u_R)-G(P_i,u_R)-f_{corr}\|_{C^{-1}}^2 \quad (4).$$

where u in this example represents the sensor parameters. As discussed previously, a fitting process is designed to determine the best fit between measured and modeled signals by minimizing the merit/cost function, including model errors calculated by the new method. As mentioned previously, in a given implementation one can choose to use only the mean model error $f_{corr}$ (omitting step 606) or only the weighing function C (omitting step 607). The form of the cost function Equation (4) would be adapted accordingly.

The measured diffraction signal f, which for the process of FIG. 6 may be a synthetic measurement image, is the sum of the 'measurement' model $H(P_i,u)$, depending on the values of the parameters defining the measured structure and the sensors, and a noise term $\epsilon$:

$$f(P_i,u)=H(P_i,u)+\epsilon \quad (5),$$

The parameters $f_{corr}$ and C are then determined by the MEC model using Equations (2) and (3).

Several approaches may be employed to determine the parameters $f_{corr}$ and C. For example, in a linear version of the MEC method, the parameters $f_{corr}$ and C are defined as follows:

$$f_{corr}=H(P_{i0},u_0)-G(P_{i0},u_0) \quad (6),$$

and $$C=C_f+(J_u^H-J_u^G)C_u(J_u^H-J_u^G)^T \quad (7),$$

where $J_u^H$ represents the Jacobian $\partial H/\partial u$, $J_u^G$ represents the Jacobian $\partial G/\partial u$ and $C_u$ is the covariance matrix of the sensor parameters. That is to say, $C_u$ represents the expected statistical distribution of the set of sensor parameters u.

The Jacobians are used to calculate the influence of the sensor parameter variations, across all parts (pixels) of the modeled diffraction pattern. The detail of statistical information available about a particular parameter or group of parameters can vary in practice. The covariance matrix $C_u$ can be simplified to diagonal form, as mentioned above.

Even when no experimental data on the statistics of a certain parameter are available, experience can be used to estimate likely nominal values and variance, and these estimates used to form the matrix $C_u$.

Note that an iterative procedure may be employed in all versions of this new method to make a better approximation of parameters $f_{corr}$ and C. In this approach, $f_{corr}$ and C are updated at each iteration of the main reconstruction loop.

CONCLUSION

To benchmark the reconstruction method including MEC against other models, error values obtained with the new reconstruction model are compared to results obtained with, for example, a conventional 'fix & float' model. The models including the MEC methods show a better performance than, for example, 'fix & float' models on example product stack. The performance of the model including the MEC method is close to the 'feed forward' method measuring extra data (H2, H3 for example) on a bare multilayer, while the latter requires extra measurements and so has a throughput disadvantage on the production line. Furthermore, by using MEC, great improvement has been obtained for the both the mean offset (bias) and variance (reproducibility) of the reconstructed parameters of interest between machines.

In conclusion, there have been disclosed above a variety of simple numerical models for correcting various types of model errors associated by identifying certain nuisance parameters. The methods do not add floating parameters to the process nor do they increase the risk of systematic deviations by fixing parameters to the wrong values. They have been demonstrated to improve the mean squared error (variance+bias2) for commercially-used product stacks and to improve 'machine to machine' matching at equal or lower computational cost than known methods. The MEC methods, being very general, can be applied to correct for other model errors such as discretization errors (concerning the subdivision of the modeled radiation and structure into a finite number of harmonics and slices).

The characterization of PDF (Pu) is a key parameter in the MEC models. In semiconductor metrology, the processes are well controlled leading to an accurate estimation of PDF (Pu). A detailed study of a commercial product stack and 'machine to machine' matching has shown that the sensitivity to errors on the estimated PDF is sufficiently weak.

In terms of computational burden (runtime), for example, the terms $f_{corr}$ and C are machine independent and may be determined offline for a specific application. In one implementation, several hours per application are needed. However, the online time required for subtraction of $f_{corr}$ from the measured pattern is negligible.

The same processing unit PU can include the entire process of FIG. 2, or different processes and sub-processes can be assigned to different processing units (not shown). The processing unit PU may operate with a computer program product containing one or more sequences of machine-readable instructions for determining an approximate structure of an object on a substrate, the instructions being adapted to cause one or more processors in the PU to perform the methods described herein. In such an arrangement, a software module running on the processing unit PU may receive the diffraction signal and the electromagnetic scattering property from the other components of the scatterometer.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein. The computer program product containing instructions implementing the process with model error correction can be supplied for modifying the operation of an existing hardware system. The computer program product may include instructions also for calculating the model of influence (terms $f_{corr}$ and C, in the example), by the method of FIG. 6 or other method. Alternatively, one computer program product may include instructions only for the online process, using a model of influence calculated at another place or time. The computing resources required for the offline process do not need to be the same ones used in the scatterometer at a manufacturing facility.

Although specific reference may be made in this text to the use of inspection methods and apparatus in the manufacture of ICs, it should be understood that the inspection methods and apparatus described herein may have other applications, such as the manufacture of integrated optical systems, guidance and detection patterns for magnetic domain memories, flat-panel displays, reticles, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The term "electromagnetic" encompasses electric and magnetic.

The term "electromagnetic scattering properties" encompasses reflection and transmission coefficients and scatterometry measurement parameters including spectra (such as intensity as a function of wavelength), diffraction patterns (intensity as a function of position/angle) and the relative intensity of transverse magnetic- and transverse electric-polarized light and/or the phase difference between the transverse magnetic- and transverse electric-polarized light. Diffraction patterns themselves may be calculated for example using reflection coefficients.

Thus, although embodiments of the present invention are described in relation to reflective scattering, the invention is also applicable to transmissive scattering.

The descriptions above are intended to be illustrative, not limiting. Thus, it will be apparent to one skilled in the art that modifications may be made to the invention as described without departing from the spirit and scope of the claims set out below.

The invention claimed is:

1. A method of measuring parameters of a structure on a substrate, comprising:
   (a) defining a mathematical model in which shape and material properties of said structure, are represented by a plurality of parameters including at least one parameter of interest;
   (b) illuminating said structure with one or more beams of radiation and detecting a signal arising from interaction between said radiation and said structure;
   (d) calculating a plurality of model signals by simulating interaction between said radiation and said mathematical model while varying the parameter of interest and while not varying at least one other parameter;
   (e) calculating a model of influence for said other parameter by simulating interaction between said radiation and said mathematical model while varying the other parameter in accordance with an assumed statistical behavior;
   (f) calculating degrees of matching between the detected signal and at least some of the model signals calculated in step (d), while using the model of influence to suppress an influence of variations of said other parameter that are not represented in the model signals; and
   (g) reporting a measurement of said parameter of interest based on the calculated degrees of matching.

2. The method as claimed in claim 1, wherein said model of influence provides a weighing matrix, by which the degree of matching between detected signal and a model signal depends more on some parts of the signal than others.

3. The method as claimed in claim 2, wherein said detected signal is a two-dimensional diffraction pattern obtained by angle-resolved scatterometry, and said weighing matrix defines for some pixels in said diffraction pattern a lower weight than other pixels for calculating the degree of matching.

4. The method as claimed in claim 1, wherein said model of influence provides a mean error signal which is subtracted from the detected signal before a degree of matching is calculated.

5. The method as claimed in claim 4, wherein said detected signal is a two-dimensional diffraction pattern obtained by angle-resolved scatterometry, and said model of influence provides a mean error matrix whereby different error values are subtracted from different pixels of the detected diffraction pattern prior to calculating the degree of matching.

6. The method as claimed in claim 1, wherein the steps (d) and (f) are performed in an iterative loop to find a value of the parameter of interest by regression, without recalculating the model of influence.

7. The method as claimed in claim 1, wherein the steps (d) and (f) are performed in an iterative loop to find a value of the parameter of interest by regression, and wherein said model of influence is recalculated after one or more iterations of said loop to take account of updates in the parameter of interest.

8. The method as claimed in claim 1, wherein said model of influence comprises one or more Jacobian matrices combined with a model of said assumed statistical behavior for a plurality of other parameters.

9. The method as claimed in claim 1, wherein said model of assumed statistical behavior comprises a nominal value and a variance for the or each said other parameter.

10. An inspection apparatus comprising:
    a support for a substrate having a structure formed thereon;
    an optical system configured to illuminate the structure with one or more beams of radiation and to detect a signal arising from interaction between said radiation and said structure;
    a processor arranged to calculate a plurality of model signals by simulating interaction between said radiation and a mathematical model in which shape and material properties of said structure are represented by a plurality of parameters including at least one parameter of interest, to calculate degrees of matching between the detected signal and at least some of the calculated model signals, and to report a measurement of said parameter of interest based on the calculated degrees of matching,
    wherein said processor is arranged to calculate said plurality of model signals while varying the parameter of interest and while not varying at least one other parameter, and
    wherein said processor is further arranged when calculating said degrees of matching to use a model of influence to suppress an influence of variations of said other parameter that may be present in the detected signal but is not represented in the model signals.

11. The inspection apparatus as claimed in claim 10, wherein said model of influence provides a weighing matrix, by which the degree of matching between detected signal and a model signal depends more on some parts of the signal than others.

12. The inspection apparatus as claimed in claim 11, wherein said detected signal is a two-dimensional diffraction pattern obtained by angle-resolved scatterometry, and said weighing matrix defines for some pixels in said diffraction pattern a lower weight than other pixels for calculating the degree of matching.

13. The inspection apparatus as claimed in claim 10, wherein said model of influence provides a mean error signal which is subtracted from the detected signal before a degree of matching is calculated.

14. The inspection apparatus as claimed in claim 13, wherein said detected signal is a two-dimensional diffraction pattern obtained by angle-resolved scatterometry, and said model of influence provides a mean error matrix whereby different error values are subtracted from different pixels of the detected diffraction pattern prior to calculating the degree of matching.

15. The inspection apparatus as claimed in claim 10, wherein the processor is arranged to perform the calculation of model signals and degrees of matching in an iterative loop to find a value of the parameter of interest by regression, without recalculating the model of influence.

16. The inspection apparatus as claimed in claim 11, wherein the processor is arranged to perform the calculation of model signals and degrees of matching in an iterative loop to find a value of the parameter of interest by regression, and is further arranged to recalculate said model of influence after one or more iterations of said loop to take account of updates in the parameter of interest.

17. The inspection apparatus as claimed in claim 10, wherein said processor is further arranged to calculate said model of influence for said other parameter by simulating interaction between said radiation and said mathematical model while varying the other parameter in accordance with an assumed statistical behavior.

18. The inspection apparatus as claimed in claim 17, wherein said model of influence comprises one or more Jacobian matrices combined with a model of said assumed statistical behavior for a plurality of other parameters.

19. A computer program product containing one or more sequences of machine-readable instructions for calculating electromagnetic scattering properties of a structure, the instructions being adapted to cause one or more processors to perform a method comprising:

defining a mathematical model in which shape and material properties of said structure, are represented by a plurality of parameters including at least one parameter of interest;

illuminating said structure with one or more beams of radiation and detecting a signal arising from interaction between said radiation and said structure;

calculating a plurality of model signals by simulating interaction between said radiation and said mathematical model while varying the parameter of interest and while not varying at least one other parameter;

calculating a model of influence for said other parameter by simulating interaction between said radiation and said mathematical model while varying the other parameter in accordance with an assumed statistical behavior;

calculating degrees of matching between the detected signal and at least some of the model signals calculated, while using the model of influence to suppress an influence of variations of said other parameter that are not represented in the model signals;

reporting a measurement of said parameter of interest based on the calculated degrees of matching.

* * * * *